(12) United States Patent
Kang et al.

(10) Patent No.: US 9,324,777 B2
(45) Date of Patent: Apr. 26, 2016

(54) ORGANIC LIGHT EMITTING DISPLAY DEVICE

(75) Inventors: Ki-Nyeng Kang, Yongin (KR);
Dong-Wook Park, Yongin (KR);
Keum-Nam Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 825 days.

(21) Appl. No.: 12/985,168

(22) Filed: Jan. 5, 2011

(65) Prior Publication Data

US 2012/0026144 A1 Feb. 2, 2012

(30) Foreign Application Priority Data

Jul. 27, 2010 (KR) .................. 10-2010-0072426

(51) Int. Cl.
*H01L 27/32* (2006.01)
*G09G 3/32* (2006.01)

(52) U.S. Cl.
CPC .......... *H01L 27/3276* (2013.01); *G09G 3/3225* (2013.01); *G09G 2300/0465* (2013.01); *G09G 2300/0861* (2013.01); *H01L 27/326* (2013.01)

(58) Field of Classification Search
CPC ....................... H01L 27/326; H01L 27/3276
USPC ............................................ 345/211, 204, 76
See application file for complete search history.

(56) References Cited

U.S. PATENT DOCUMENTS

| 7,414,599 B2 | 8/2008 | Chung et al. | |
| 2004/0252089 A1* | 12/2004 | Ono et al. | 345/82 |
| 2005/0264498 A1* | 12/2005 | Asano | G09G 3/3233 |
| | | | 345/76 |
| 2006/0017393 A1* | 1/2006 | Kang et al. | 315/169.3 |
| 2007/0001937 A1* | 1/2007 | Park et al. | 345/76 |
| 2009/0135104 A1* | 5/2009 | Jeong | 345/76 |
| 2009/0189850 A1* | 7/2009 | Murayama | G09G 3/344 |
| | | | 345/107 |
| 2010/0044763 A1* | 2/2010 | Borg | 257/292 |

FOREIGN PATENT DOCUMENTS

| KR | 10-2004-0059037 | 7/2004 |
| KR | 10-2005-0005646 | 1/2005 |
| KR | 10-2008-0062309 | 7/2008 |
| KR | 10-2009-0078633 | 7/2009 |

* cited by examiner

*Primary Examiner* — Premal Patel
*Assistant Examiner* — Sarvesh J Nadkarni
(74) *Attorney, Agent, or Firm* — Lewis Roca Rothgerber Christie LLP

(57) ABSTRACT

There is provided an organic light emitting display device for preventing short and voltage drop between lines to improve yield. The organic light emitting display device includes: a plurality of sub-pixels located at crossing regions of a plurality of gate lines and a plurality of data lines; first power lines for supplying a voltage for driving the sub-pixels, each of the first power lines being shared by two adjacent sub-pixels from among the plurality of sub-pixels; and initial power lines for supplying an initial power to the sub-pixels, each of the initial power lines being shared by the two adjacent sub-pixels and located between the two adjacent sub-pixels.

3 Claims, 3 Drawing Sheets

ORGANIC LIGHT EMITTING DISPLAY DEVICE

CROSS-REFERENCE TO RELATED APPLICATION

This application claims priority to and the benefit of Korean Patent Application No. 10-2010-0072426, filed on Jul. 27, 2010, in the Korean Intellectual Property Office, the entire content of which is incorporated herein by reference.

BACKGROUND

1. Field

The present invention relates to a display device, and more particularly, to an organic light emitting display device.

2. Description of the Related Art

Recently, researches for display devices such as liquid crystal display devices (LCDs), plasma display panels (PDPs), field emission display devices (FEDs), electrophoretic display devices (EPDs), and organic light emitting display devices are conducted as the information society is evolving and various demands for display devices are increasing.

The organic light emitting display device displays an image using organic light emitting diodes (OLEDs) that generate light by re-combination of electrons supplied by a cathode and holes supplied by an anode.

The organic light emitting display device is primarily used recently due to advantages of a high response speed, of being driven with low power consumption due to a thin film structure, and of displaying all colors in a visible region to satisfy various demands of modern users.

An organic light emitting display device includes a plurality of sub-pixels defined by gate lines and data lines which cross each other and power lines spaced apart from the data lines. The power line serves as a terminal of a storage capacitor for storing a signal supplied through the data line and as a path through which the current flowing through a driving transistor stably exits.

Since image quality on a display panel is uniform (or substantially uniform) when IR drop (e.g., a voltage drop) occurring on the power lines is low, width of the power lines should be increased or maximized, or resistance of the power lines should be reduced or minimized, in order to improve uniformity of the image quality caused by the IR drop.

However, since, in a layout structure of an array unit, the possibility of a short between several lines including metal material such as the power lines, gate lines, data lines, and initial power source lines is increased as the width of the power lines is increased, there is a limit to increasing the width of the power lines.

In addition, a short may be generated between the lines due to foreign matter generated during the process of the layout of the array unit and a dark spot may be generated. Moreover, since a display panel on which a short is generated between the lines is discarded, yield of the organic light emitting display device is reduced.

SUMMARY

Accordingly, embodiments according to the present invention have been made to provide an organic light emitting display device for preventing or reducing a short and IR drop between lines to improve yield.

In order to achieve the foregoing and/or other aspects of the present invention, according to an embodiment of the present invention, there is provided an organic light emitting display device that includes: a plurality of sub-pixels located at crossing regions of a plurality of gate lines and a plurality of data lines; first power lines for supplying a voltage for driving the sub-pixels, each of the first power lines being shared by two adjacent sub-pixels from among the plurality of sub-pixels; and initial power lines for supplying an initial power to the sub-pixels, each of the initial power lines being shared by the two adjacent sub-pixels and located between the two adjacent sub-pixels.

The first power lines may be arranged in the form of a mesh in which a horizontal first power line of the first power lines is coupled to a vertical first power line of the first power lines.

The initial power lines may be in parallel to the vertical first power line and may be spaced from the vertical first power line.

The initial power lines may include a same material as the vertical first power line and may be at a same layer as the vertical first power line.

The horizontal first power line may include a same material as the gate lines on the same layer as the gate lines; and the vertical first power line may include a same material as the data lines and may be at a same layer as the data lines.

The horizontal first power line may be between two adjacent sub-pixels respectively on two adjacent rows and the vertical first power line may be located at every two sub-pixels respectively on two adjacent columns, wherein the horizontal first power line and the vertical first power line may be electrically coupled to each other.

The horizontal first power line may be parallel to the gate lines and may be spaced therefrom, and the vertical first power line may be parallel to the data lines with the sub-pixels interposed therebetween.

Each of the initial power lines may be shared by the two adjacent sub-pixels respectively on two adjacent columns.

The initial power lines may be parallel to the data lines with the sub-pixels interposed therebetween.

The initial power lines may include a same material as the data lines and may be at a same layer as the data lines.

The initial power lines may be coupled to active layers of a single line through a contact hole and the active layers of the single line may include two lines spaced from each other in a region overlapped with the first power lines.

The active layers distributed as the two lines may be arranged in parallel to the initial power lines between the two adjacent sub-pixels and may be branched respectively to the two adjacent sub-pixels.

The sub-pixels may include pairs of six sub-pixels, and three initial power lines and three first power lines may be arranged corresponding to the six sub-pixels.

Each of the sub-pixels may include: an organic light emitting diode for displaying an image according to a driving current; a driving switching device for delivering the driving current corresponding to a data signal supplied from the data lines to the organic light emitting diode; a storage capacitor for maintaining a voltage for emission of the organic light emitting diode, the storage capacitor being located between the driving switching device and the first power lines; an initial switching device for initializing a voltage stored in the storage capacitor; and a second power line having a ground voltage level or a negative voltage level lower than a voltage level supplied by the first power line.

One of the initial power lines may be coupled to the two initial switching devices of the two adjacent sub-pixels.

In another embodiment according to the present invention, an organic light emitting display device includes: a plurality of sub-pixels located at crossing regions of a plurality of gate lines and a plurality of data lines; and first power lines for supplying a voltage for driving the sub-pixels, each of the first power lines being shared by two adjacent sub-pixels and located between the two adjacent sub-pixels, wherein each of the sub-pixels includes: a driving switching device for delivering a driving current corresponding to a data signal supplied from the data lines to an organic light emitting diode; a storage capacitor for maintaining a voltage for emission of the organic light emitting diode, the storage capacitor being located between the driving switching device and the first power lines; and an initial switching device for initializing a voltage stored in the storage capacitor.

Each of the initial power lines may be shared by the two adjacent sub-pixels respectively on two adjacent columns, and may be in parallel to the data lines with the sub-pixels interposed therebetween.

The first power lines may be arranged in the form of a mesh structure in which horizontal first power lines parallel to the gate lines from among the first power lines may be coupled to vertical first power lines parallel to the initial power lines from among the first power lines.

The initial power lines may include a same material as the data lines and may be at a same layer as the data lines, or may include a same material as the first power lines and may be at a same layer as the first power lines.

The initial power lines may be coupled to active layers of a single line through a contact hole, the active layers of the single line may include two lines spaced from each other in a region overlapped with the first power lines and extend to a region where the horizontal first power lines are arranged, and the active layers distributed as the two lines are branched respectively to the two adjacent sub-pixels at a region where the horizontal first power lines are arranged.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
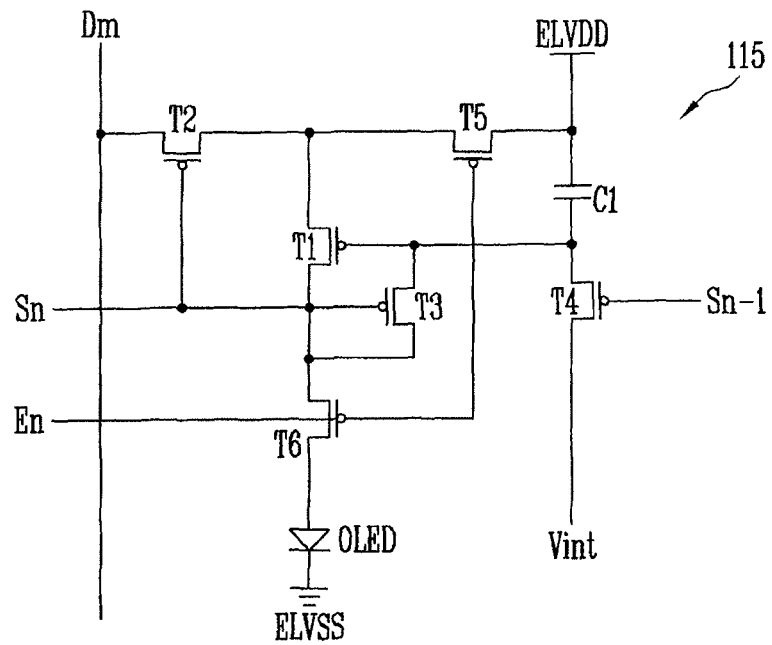
FIG. 1 is a view illustrating an equivalent circuit diagram of a sub-pixel of an organic light emitting display device according to an embodiment of the present invention.

Hereinafter, certain exemplary embodiments according to the present invention will be described with reference to the accompanying drawings. Here, when a first element is described as being coupled to a second element, the first element may be directly coupled to the second element or may be indirectly coupled to the second element via a third element. Further, some of the elements that are not essential to a complete understanding of the invention are omitted for clarity. Also, like reference numerals refer to like elements throughout.

Hereinafter, an organic light emitting display device according to an embodiment of the present invention will be described in detail with reference to the accompanying drawings.

Here, i) shapes, sizes, ratios, angles, and numbers that are schematically illustrated in the accompanying drawings may be slightly varied within the scope of the present invention. ii) Since the drawings are depicted from an observer's point of view, the directions and positions illustrated in the drawings may be variously changed according to the observer's position. iii) Same reference numerals may be assigned to the same part in different drawings.

iv) In the case where the terms 'comprising', 'having', and 'including' are used, another element may be added. One exception may arise if the term 'only' is used. v) A singularity may be interpreted as plurality. vi) Although shapes, comparison of size, and positional relationship are not explained by 'about', 'substantially', etc., the shapes, comparison of size, and positional relationship are interpreted to include usual error range.

vii) Although the terms 'after ~', 'before ~', 'then', 'and', 'here', 'next', 'at this time', and 'in this case' are used, the terms do not mean the limitation to any particular point in time. viii) The terms 'first', 'second', and 'third', etc. are used merely for the convenience of referring to different parts, selectively, exchangeably, or repeatedly, and should not be interpreted to be limiting to any particular sequence or order.

ix) In the case where positional relationship between two parts such as 'on ~', 'above ~', 'under ~', and 'beside ~' is described, one or more other part may be positioned between the two parts. One exception may arise if the term 'directly' is used. x) When parts are connected by the term 'or', the connection is interpreted to include not only the parts but also the combinations of the parts.

Hereinafter, the organic light emitting display device according to an embodiment of the present invention will be described primarily in reference to one sub-pixel, however this description is also applied to other sub-pixels in the organic light emitting display device according to an embodiment of the present invention.

Referring to FIG. 1, an organic light emitting display device according to an embodiment of the present invention includes a plurality of sub-pixels 115 formed at crossing regions between a plurality of gate lines (or scan lines) Sn−1 and Sn and a plurality of data lines Dm, and a plurality of power lines ELVDD, ELVSS, and Vint. The organic light emitting display device of embodiments according to the present invention will be described by using a 6T1C structure (e.g., each sub-pixel includes 6 TFTs and one capacitor). However, the present invention is not limited to the pixel circuit as illustrated in the drawings, but may be applied to other suitable pixel circuits receiving ELVDD, and a second power source and/or a control voltage.

The sub-pixel 115 is defined by (e.g., located at a crossing region of) the plurality of gate lines Sn−1 and Sn and the plurality of data lines Dm. The sub-pixel 115 includes an organic light emitting diode OLED for displaying an image with a driving current, a first switching device T1 electrically coupled to the OLED to supply a driving current to the OLED, a storage capacitor C1, second to sixth switching devices T2 to T6, and an emission control line En.

The OLED is electrically coupled to the first switching device T1 at a node, and has a cathode electrically coupled to a second power line ELVSS. The OLED generates light of one of red color R, green color G, and blue color B in response to the driving current supplied through the first switching device T1.

The first switching device T1 is a driving switching device for delivering the driving current corresponding to a data signal that is supplied from the data lines Dm to the OLED.

To this end, the first switching device T1 includes a first electrode (source or drain) electrically coupled to the first power line ELVDD via the fifth switching device T5, a second electrode (drain or source) electrically coupled to the anode of the OLED via the sixth switching device T6, and a gate electrode driven according to a data signal supplied from the data lines Dm.

Here, the first electrode is set to one of a drain electrode and a source electrode and the second electrode is set to the other of the drain electrode and the source electrode. For example, when the first electrode is the source electrode, the second electrode is the drain electrode.

The storage capacitor C1 stores a voltage corresponding to the data signal between the first electrode (source or drain) and the control electrode of the first switching device T1 to maintain a voltage necessary for the OLED to emit light.

To this end, the storage capacitor C1 is positioned between a control electrode of the first switching device T1 and the first power line ELVDD. The storage capacitor C1 includes a first electrode electrically coupled to the control electrode (or the gate electrode) of the first switching device T1 and a second electrode electrically coupled to the first power line ELVDD and the first electrode (source or drain) of the first switching device T1 (when the switching device T5 is turned on).

The second switching device T2 is turned on when a gate signal is supplied to an nth gate line Sn, and supplies a data signal supplied through the data line Dm to the storage capacitor C1 via the first electrode of the first switching device T1.

To this end, the second switching device T2 includes a first electrode coupled to the data line Dm, a second electrode coupled to the first electrode of the first switching device T1, and a gate electrode coupled to the nth gate line Sn.

The third switching device T3 is turned on when a gate signal is supplied to the nth gate line Sn and couples the first switching device T1 in the form of a diode. In other words, the first switch device is diode-coupled (or diode-connected) when the third switching device T3 is turned on.

To this end, the third switching device T3 includes a gate electrode electrically coupled to the nth gate line Sn, a first electrode electrically coupled to the second electrode of the first switching device T1, and a second electrode electrically coupled to the gate electrode of the first switching device T1. Here, the second electrode of the third switching device T3 may be electrically coupled to the first electrode of the storage capacitor C1.

The fourth switching device T4 is turned on when a previous gate signal is supplied (e.g., via an (n−1)th gate line Sn−1), and initializes a voltage stored in the storage capacitor C1. In one embodiment, a voltage of the initial power line Vint is set to a voltage lower than a voltage of the data signal. For example, the voltage of the initial power line Vint may be set to a negative voltage.

To this end, the fourth switching device T4 includes a gate electrode electrically coupled to an (n−1)th gate line Sn−1 as a previous gate line, a first electrode electrically coupled to the first electrode of the storage capacitor C1, and a second electrode electrically coupled to the initial power line Vint. The first electrode of the fourth switching device T4 may be electrically coupled to the gate electrode of the first switching device T1 and/or the second electrode of the third switching device T3.

Since, in an initial period where a previous gate signal has a low level and a current gate signal and a current emission control signal each have a high level, the fourth switching device T4 is turned on by the previous gate signal and other switching devices (e.g., switching devices T2, T3, T5 and T6) are turned off by the current gate signal and the current emission control signal. The initialization is performed by data stored in the storage capacitor C1, that is, initialization of a gate voltage of the first switching device T1.

The fifth switching device T5 delivers first power from the first power line ELVDD to the first electrode of the first switching device T1 according to the emission control signal supplied from the emission control line En. In the described embodiment, the fifth switching device T5 is turned on when the emission control signal is not supplied (that is, a low level voltage is supplied), and electrically couples the first power line ELVDD to the first switching device T1.

To this end, the fifth switching device T5 includes a first electrode electrically coupled to the first power line ELVDD, a second electrode electrically coupled to the first electrode of the first switching device T1, and a gate electrode electrically coupled to the emission control line En.

The sixth switching device T6 is a switching device for controlling the driving current flowing from the first switching device T1 to the OLED according to the emission control signal supplied from the emission control line En and for determining an emission time of the OLED. The sixth switching device T6 is turned on when the emission control signal is not supplied (that is, a low level voltage is supplied) and electrically couples the first switching device T1 to the OLED.

To this end, the sixth switching device T6 includes a first electrode electrically coupled to the second electrode of the first switching device T1, a second electrode electrically coupled to the anode of the OLED, and a gate electrode electrically coupled to the emission control line En. The sixth switching device T6 may be electrically coupled to the first electrode of the third switching device T3.

The first power line ELVDD and the second power line ELVSS respectively supply a first power source voltage and a second power source voltage (e.g., a reference voltage), together referred to as "power source voltages", for driving the sub-pixel 115. At this time, the voltage supplied by the second power line ELVSS has a voltage level lower than a voltage level of the voltage supplied by the first power line ELVDD. For example, the second power line ELVSS may have a voltage level of a ground voltage or a negative voltage.

The initial power line Vint supplies an initial voltage (e.g., an initialization voltage) for initializing the sub-pixel 115. The initial power line Vint has a voltage level lower than a data signal having the lowest voltage level from among the data signals that are supplied to the storage capacitor C1.

Figure 2:
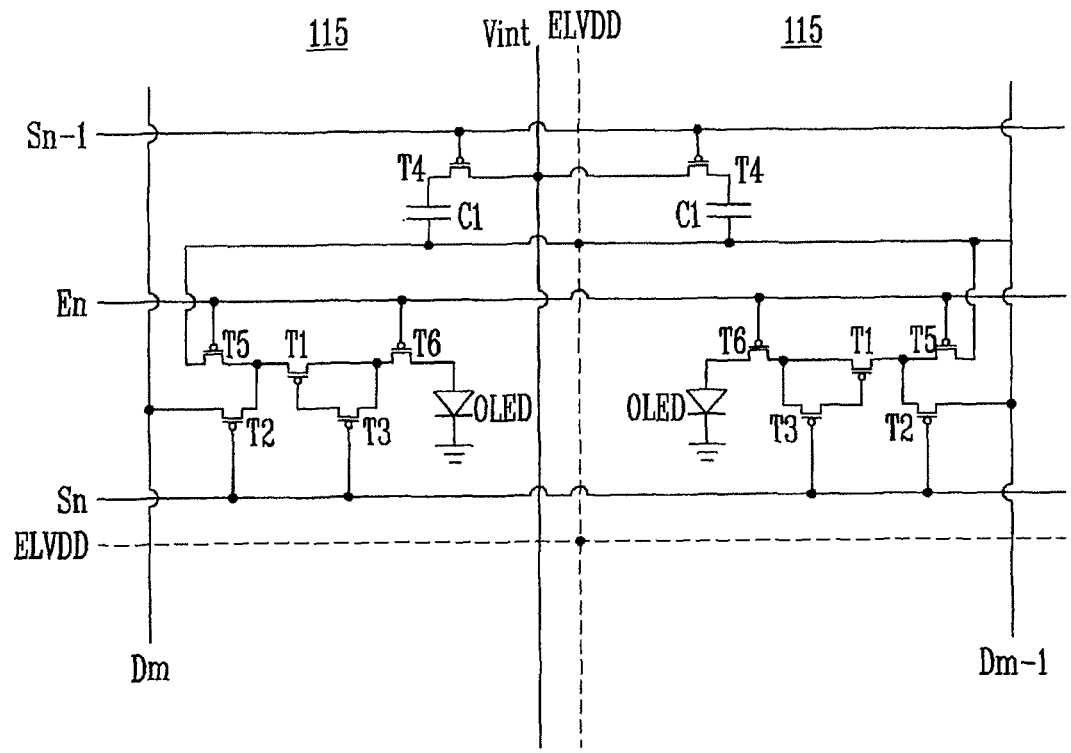
FIG. 2 is a circuit diagram schematically illustrating the organic light emitting display device of FIG. 1.

Referring to FIG. 2, the initial power line Vint is electrically coupled to the second electrode of the fourth switching device T4. Here, the initial power line Vint is electrically coupled to the second electrode of the fourth switching device T4 as an initial switching device of an adjacent sub-pixel 115 such that two adjacent sub-pixels 115 share the initial power source.

Hereinafter, coupling and structure between the initial power line Vint and the sub-pixels will be described with reference to a layout arrangement in detail.

Figure 3:
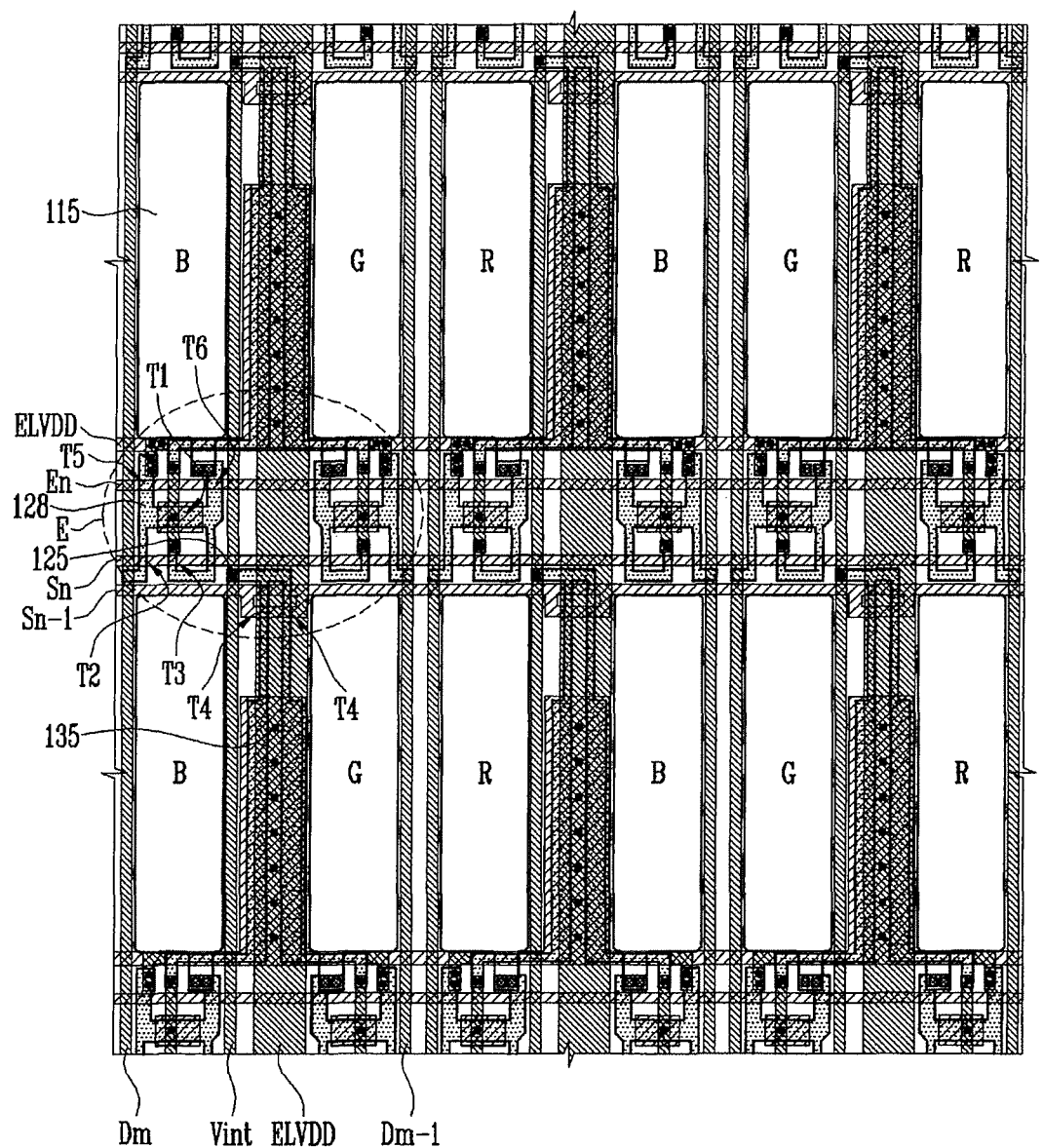
FIG. 3 is a view illustrating an arrangement of a layout of the organic light emitting display device of FIG. 1.
Figure 4:
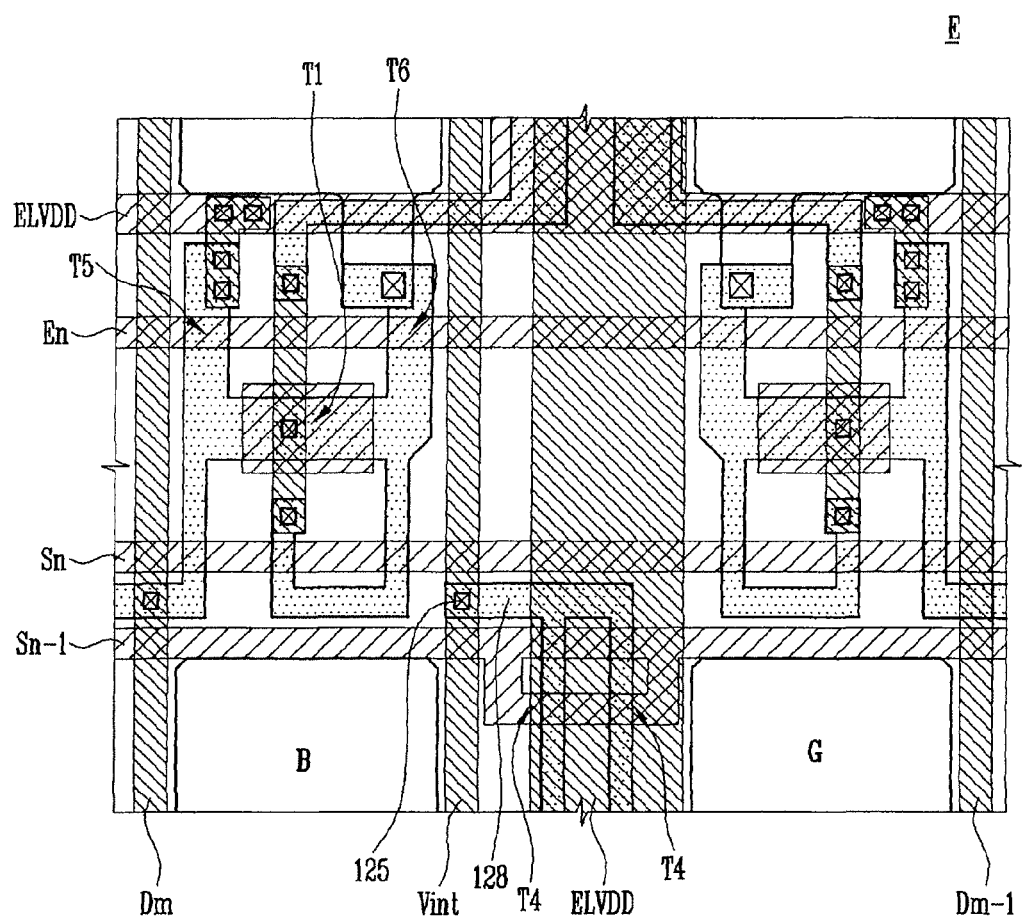
FIG. 4 is a partial enlarged view illustrating an E-region of the organic light emitting display device of FIG. 3.

Referring to FIGS. 3 and 4, the plurality of sub-pixels 115 (e.g., 12 sub-pixels as shown in FIG. 3) defined by gate lines Sn−1, and Sn and data lines . . . , Dm−1, and Dm crossing (e.g., perpendicularly crossing) the gate lines . . . , Sn−1, and Sn and insulated by an insulating layer are divided into six pairs of sub-pixels. The six sub-pixels 115 on each row may be arranged in the order of R-, G-, B-, R-, G-, and B-sub-pixels 115 from the right side.

The sub-pixels 115 form a substantially symmetric structure with respect to the initial power line Vint and the first power line ELVDD. The initial power line Vint and the first power line ELVDD are arranged to share two adjacent sub-pixels 115. At this time, the initial power line Vint and the first power line ELVDD share two same sub-pixels 115. For example, each of the initial power line Vint and the first power line ELVDD is shared by two columns of the sub-pixels that are adjacent to the initial power line Vint and the first power line ELVDD.

The initial power line Vint is arranged between two adjacent sub-pixels 115 sharing the initial power line Vint and is spaced apart from the first power line ELVDD that is arranged in parallel. In FIG. 3, both the initial power line Vint and the first power line ELVDD extend in a vertical (e.g., column) direction. The initial power line Vint is arranged in parallel to the data line, and a sub-pixel 115, to which the initial power line Vint applies an initial power of the initial power source, is interposed between the data line and the initial power line Vint.

In the described embodiment of the present invention, the initial power line Vint is not arranged in the horizontal direction (e.g., row direction) but in the vertical direction (e.g., column direction) so that the layout margin of the gate line and the emission control line that are arranged in the horizontal direction can be sufficiently secured.

The initial power line Vint may be made of the same material as the first power line ELVDD on the same layer as the first power line ELVDD or of the same material as the data line on the same layer as the data line. The initial power line Vint is coupled to an active layer through a contact hole 125. The active layer 128 is coupled to the initial power line Vint by a single line and extends to a region where the first power line ELVDD is arranged in the vertical direction (e.g., column direction).

The extended active layer 128 is distributed by two lines spaced apart from each other in the region where the first power line ELVDD extends in the vertical direction (e.g., column direction). Here, the two distributed lines of the active layer 128 are arranged in parallel to the initial power line Vint and are overlapped with the first power line ELVDD extending in the vertical direction (e.g., column direction). In other words, the extended portion of the active layer 128 that overlaps with the vertically oriented first power line ELVDD is parallel to the initial power line Vint and includes two parallel line portions that are spaced from each other.

The portion of the active layer 128 that includes the two lines form a channel layer of the fourth switching device T4 as the initial switching device in a region overlapped with an (N−1)th gate line. The two-lined active layer 128 extends to the horizontal first power line ELVDD below the sub-pixels 115 and is branched to the two adjacent sub-pixels 115 in the region where the first power line ELVDD is arranged in the horizontal direction.

The first power line ELVDD is arranged in the form of a mesh structure in which the vertical portion (e.g., the portion that extends in the column direction) of the first power line ELVDD is coupled to the horizontal portion (e.g., the portion that extends in the row direction) of the first power line ELVDD. The vertical portion and the horizontal portion may also be referred to as a vertical first power line or a horizontal first power line, respectively. The vertical portion of the first power line ELVDD is arranged in parallel to the initial power line Vint between two adjacent sub-pixels 115 that share the first power line ELVDD and is spaced apart from the initial power line Vint. The vertical portion of the first power line ELVDD may be arranged parallel to the data line and may be interposed between the adjacent sub-pixel 115.

The vertical portions of the first power lines ELVDD are arranged to correspond to every two adjacent right and left (column line) sub-pixels for sharing a power source, and the horizontal portions of the first power lines ELVDD are arranged to correspond to every upper and lower (row line) sub-pixels 115. In this case, the horizontal first power line ELVDD is arranged between the emission control line En and the sub-pixel 115 above the emission control line En to be spaced apart from the emission control line En or the gate line in parallel.

The vertical portion of the first power line ELVDD may be made of the same material as the initial power line Vint or the data line on the same layer as the initial power line Vint, and the horizontal portion of the first power line ELVDD may be made of the same material as the gate line on the same layer as the gate line. Here, the vertical portion of the first power line ELVDD is electrically coupled to the horizontal portion of the first power line ELVDD through the contact hole 135.

In embodiments according to the present invention, the first power line ELVDD has the mesh structure to supply power in the horizontal direction (e.g., row direction) and in the vertical direction (e.g., column direction) so that the region of lines for supplying power extends further and the IR drop caused by resistance of the line itself can be overcome or reduced.

In addition, since the initial power line Vint is designed one per two sub-pixels, a total area (or width) occupied by the initial power line Vint can be reduced as compared to the conventional design, and the width of the first power line ELVDD can be relatively increased or maximized.

As such, according to embodiments of the present invention, the width of the first power line ELVDD may be increased and the region of the first power line ELVDD is expanded so that IR drop is overcome or reduced, and the image quality of the organic light emitting display device can be uniform and stabilized.

Furthermore, according to the conventional art, since a total of three vertical lines are provided per one sub-pixel (or a column of sub-pixels), six sub-pixels in the same row need a total of eighteen vertical lines. However, as described above, when one initial power line and one first power line are provided per two adjacent sub-pixels, a total of four vertical lines are provided per two sub-pixels. Since three initial power lines and three first power lines are provided to six pairs of sub-pixels, a total of six vertical lines are provided for the six pairs of sub-pixels, including a total of 6 sub-pixels on a first row and a total of 6 sub-pixels on a second row. If the initial power lines and the first power lines corresponding to different rows are considered as different initial power lines and different first power lines, a total of twelve lines would be provided to the six pairs of sub-pixels as shown in FIG. 3.

Therefore, according to embodiments of the present invention, since the number of lines to be designed is reduced and the number of patterning (process) is reduced, the process is simplified and a short generated between the lines caused by foreign matter during the patterning can be reduced and yield can be improved.

Here, the data lines are vertically arranged in parallel to the initial power line Vint adjacent to the sub-pixel 115 for each of the sub-pixels 115 one by one. The data lines are arranged outside two adjacent sub-pixels 115 that share the initial power line Vint.

The data lines are formed outside the sub-pixels 115 with respect to two adjacent sub-pixels 115 sharing the initial power line Vint, but two data lines are formed between the sub-pixels 115 with respect to two adjacent sub-pixels 115 not sharing the initial power line Vint.

For example, when a B-sub-pixel 115 and G-sub-pixel 115 share the initial power line Vint, the data line of the B-sub-pixel 115 is formed at one outside of the B-sub-pixel 115 and the data line of the G-sub-pixel 115 is formed at the other outside of the G-sub-pixel 115.

The present invention has been described in connection with certain exemplary embodiments. It is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display device comprising:
    a plurality of sub-pixels located at crossing regions of a plurality of gate lines and a plurality of data lines;
    first power lines for supplying a voltage for driving the sub-pixels, each of the first power lines being shared by two adjacent sub-pixels respectively located on two adjacent columns, and located between the two adjacent sub-pixels; and
    initial power lines for supplying an initial power to the sub-pixels, each of the initial power lines being shared by the two adjacent sub-pixels and located between the two adjacent sub-pixels,
    wherein each of the sub-pixels comprises:
        a driving switching device for delivering a driving current corresponding to a data signal supplied from the data lines to an organic light emitting diode;
        a storage capacitor for maintaining a voltage for emission of the organic light emitting diode, the storage capacitor being located between the driving switching device and the first power lines; and
        an initial switching device for initializing a voltage stored in the storage capacitor,
    wherein the first power lines are arranged in the form of a mesh structure in which horizontal first power lines parallel to the gate lines from among the first power lines are coupled to vertical first power lines parallel to the initial power lines from among the first power lines,
    wherein the initial power lines are coupled to active layers of a single line through a contact hole,
    wherein the active layers of the single line comprise two lines spaced from each other in a region overlapped with the first power lines and extend to a region where the horizontal first power lines are arranged, and
    wherein the active layers distributed as the two lines are branched respectively to the two adjacent sub-pixels at a region where the horizontal first power lines are arranged.

2. The organic light emitting display device as claimed in claim 1, wherein each of the initial power lines is in parallel to the data lines with the sub-pixels interposed therebetween.

3. The organic light emitting display device as claimed in claim 1, wherein the initial power lines comprise a same material as the data lines and are at a same layer as the data lines, or comprise a same material as the first power lines and are at a same layer as the first power lines.

* * * * *